United States Patent [19]

Ohhashi et al.

[11] Patent Number: 5,415,829

[45] Date of Patent: May 16, 1995

[54] SPUTTERING TARGET

[75] Inventors: Tateo Ohhashi; Takakazu Seki; Takeo Okabe; Koichi Yasui; Hideaki Fukuyo, all of Kitaibaraki, Japan

[73] Assignee: Nikko Kyodo Co., Ltd., Tokyo, Japan

[21] Appl. No.: 172,504

[22] Filed: Dec. 22, 1993

[30] Foreign Application Priority Data

Dec. 28, 1992 [JP] Japan ................... 4-358775
Dec. 28, 1992 [JP] Japan ................... 4-358776
Dec. 28, 1992 [JP] Japan ................... 4-358777
Dec. 28, 1992 [JP] Japan ................... 4-358778

[51] Int. Cl.$^6$ ........................... B22F 3/15
[52] U.S. Cl. ........................... 419/23; 419/32; 419/33; 419/49
[58] Field of Search .............. 419/23, 32, 33, 49; 75/248

[56] References Cited

U.S. PATENT DOCUMENTS

| | | | |
|---|---|---|---|
| 4,663,120 | 5/1987 | Parent et al. | 419/10 |
| 4,731,116 | 3/1988 | Kuy | 75/238 |
| 5,160,534 | 11/1992 | Hiraki | 75/248 |
| 5,294,321 | 3/1994 | Satou et al. | 204/298.13 |
| 5,298,338 | 3/1994 | Hiraki | 428/569 |
| 5,306,569 | 4/1994 | Hiraki | 428/569 |

*Primary Examiner*—Nguclan Mai
*Attorney, Agent, or Firm*—Seidel Gonda Lavorgna & Monaco

[57] ABSTRACT

A method of manufacturing metal silicide targets or alloy targets for sputtering use comprises the steps of (a) mechanically alloying silicon and a metal to provide a metal silicide powder or mechanically alloying silicon and a plurality of metal powders to provide an alloy powder, (b) and then pressing the metal silicide powder or alloy powder. The invention also relates to the metal silicide targets or alloy targets so manufactured. In the mechanical alloying step, rapid and fine division and agglomeration of the mixed powder is repeated until the particles of the material powders are finely divided to a submicron level. They form aggregates tens of microns in diameter. The aggregates gradually take an equi-axed shape. Homogenization of the material powder mixture progresses to mixing on the atomic level, until alloying takes place.

19 Claims, No Drawings

SPUTTERING TARGET

[FIELD OF THE INVENTION]

The present invention relates to a technique of fabricating targets for sputtering use, and more specifically to a method of manufacturing sputtering targets characterized by pressing a metal silicide powder or metal alloy powder obtained by mechanical alloying. The invention relates also to the targets so made. Examples of metal alloys are the alloys of refractory metals, especially W—Ti alloys and other Ti-containing refractory metal alloys.

[BACKGROUND OF THE INVENTION]

Sputtering targets serve as sources of materials to be sputtered on substrates to form electrodes, gates, wirings, elements, protective films and the like for various semiconductor devices. Sputtering targets usually take the form of disk-shaped plates. As accelerated particles impinge on a target surface, the atoms constituting the target are partly released by momentum exchange to deposit on a substrate. Typical sputtering targets in use include targets made of Al alloys, refractory metals and alloys (W, Mo, Ti, Ta, Zr, Nb, etc. and their alloys such as W—Ti), and metal silicides ($MoSi_x$, $WSi_x$, $NiSi_x$, etc.). Metal silicides, and refractory metals and their alloys, are particularly useful because of their high melting points, oxidation resistance, and other merits. Among the alloy targets, targets of W—Ti alloys are predominantly used in forming diffusion barriers for various integrated circuit devices of one megabit or higher capacities. It is known that a W—Ti sputtering target may be used to form a W—Ti alloy film as a diffusion barrier for IC devices. For instance, the formation of diffusion barriers by sputtering using a W-10 wt % Ti alloy target has been put into practice. In fact, some types of W—Ti alloy targets are already available on the market.

Metal silicide targets for sputtering, having a silicon/metal molar ratio in excess of 2, are generally made by compacting and sintering a synthetic silicide powder formed by the silicidizing reaction between silicon and metal powders. Their crystal structures comprise binary phases, i.e., silicide and free silicon phases, corresponding to the given silicon molar ratios of the individual silicides. The sizes of the respective phases depend largely upon the particle diameters of the synthetic silicide powder and the silicon powder added for molar ratio adjustment.

A recent problem in the art is the deposition of coarse particulate deposits, commonly known as "particles" on films formed by sputtering. By porticles is meant the deposits which form on a substrate as clusters of particles which have been scattered within a sputtering chamber during the course of thin film formation. The clustered particles often have sizes as large as several microns, and their deposition on the substrate can cause troubles. For example, the particles can cause shorting or even breaking of wirings or interconnections of LSI devices, leading to an increased percentage of rejects. The deposited particles come from varied sources, partly originating from the target itself and partly from the thin film forming system.

Much attention is now focused, above all, upon the particles originating from targets. In the case of metal silicide targets, coarse free silicon phases in the crystal structure of silicide targets have been found primarily responsible for particle generation and evolution. With the view of reducing the rate of particle formation, there is a demand for targets of more homogeneous and finer crystal structures. The demand has been met somewhat by the pulverization of silicide powder and silicon powder prior to their compaction and sintering. This countermeasure is relatively easy to implement. However, when further homogeneity and fineness of target crystal structures is required in the future, problems of process complexity and contamination with oxygen and other impurities will arise. This is because the size reduction of particles involves a vast increase in the specific surface area, in geometrical progression.

Specifically, the attainment of more homogeneous and finer target crystal structures is essential for further reduction of porticle produced from targets in the future. The conventional process that consists of chemically synthesizing a silicide powder from a fine refractory metal powder and a fine silicon powder, and then grinding and classifying the silicide powder to finer powder particles, poses the following problems:

(1) The silicidizing reaction is exothermic, and the finer is the refractory metal powder and the silicon powder starting materials, the faster the reaction progresses, with increasing difficulty of control.

(2) The grinding and classification steps required for fining down the silicide and silicon powders are not practically feasible since the steps are beyond the performance limits of existing ball mills, classifiers, etc.

(3) Fine division of silicide and silicon powders raise concerns over contamination with increased oxygen concentrations, due to the increased specific surface areas of the powders.

(4) Further, in connection with the above oxidation problem, it is to be noted that minimizing the oxidation that inevitably results from compaction and sintering is a key to successful fabrication of high-quality sputtering targets. Tackling the problem from this perspective too seems necessary.

The same oxidation and particle problems exist in alloy targets, especially Ti-containing refractory metal alloy targets. These problems will now be explained using a W—Ti alloy target as an example. A W—Ti alloy target is made by powder metallurgy from a mixture of tungsten and titanium powders. The target is made by either cold pressing followed by sintering, or by hot pressing. Commercial titanium powder, one of the starting materials, has a high oxygen content. This is because titanium is active enough to be readily oxidized, and inevitably has an oxide surface film. Titanium powder in the form of smaller particles with a larger overall surface area has a very large total oxygen content. Targets made by powder metallurgy from a titanium powder with such a high oxygen content are naturally high in oxygen content. Sputtering using an oxygen-rich target is undesirable. The liberation of oxygen can cause problems such as target cracking, oxidation of the resulting film, and loss of uniform film quality. For example, commercially available W—Ti alloy targets contain at least 1240 ppm and in most cases 2500 ppm or more, oxygen. The oxygen content is too large for the formation of high-quality insulation barriers or the like.

Under these circumstances, we conceived the idea of using titanium hydride ($TiH_2$) powder as a titanium source and dehydrogenating it afterwards. We then proposed, in Patent Application Public Disclosure No.303017/1988, a method of manufacturing a W—Ti alloy target characterized by the steps of mixing tungsten (W) powder with titanium hydride (TiH$_2$) powder, and hot pressing the powder mixture after or concurrently with its dehydrogenation. The method has made possible the manufacture of W—Ti alloy targets having a lower oxygen content, with reasonably good success.

Nevertheless, sputtering with those targets has caused a new problem; they give off so many particles that they can hardly be used in fabricating devices with wirings less than one micron wide, e.g., 0.5 $\mu$m wide. We found some time ago that commercially available W—Ti alloy targets are characterized by a large average particle diameter of their Ti-rich phases, ranging from tens of microns to about one hundred microns. We found that sputtering of such targets allows preferentially spattering of the coarse Ti-rich phases, thus contributing to the large particle production. We then tried using a titanium hydride (TiH$_2$) powder 60 $\mu$m or smaller in particle size as a titanium source, mixing the powder with a tungsten powder, and hot pressing the mixed powder after or simultaneously with dehydrogenation. In this way the particle size of the Ti-rich phases in the W—Ti alloy target was decreased to 50 $\mu$m or less, and the particle production was successfully reduced while maintaining a low oxygen content (Patent Application Public Disclosure No.232260/1992). This process, however, requires the preparation of a titanium hydride powder and dehydrogenation of the mixed powder of titanium hydride and tungsten powders. Hydrogenation is a highly hazardous step. A abrupt hydrogen absorption produces a negative pressure inside the oven or reactor used for the powder preparation. Dehydrogenation, which is performed in a vacuum or inert atmosphere at a temperature between 500° and 700° C., demands special care to prevent an increase the oxygen content, and to control the evolving hydrogen.

It is likely that targets in the future will be required to have more homogeneous and finer crystal structures so as to reduce the particle production. Finer division of the raw material powders to satisfy this requirement will be accompanied with a vast increase in the specific surface area, in geometrical progression. The latter, in turn, will present process complication and contamination with impurities such as oxygen. Finer grinding and classification will become practically impossible since. These practices will overburden existing ball mills, classifiers, etc. A manufacturing process that involves mixing currently available titanium source powder with tungsten powder and hot pressing the mixture has its limitations from the viewpoint of further powder size reduction, as in the case of the metal silicide powder discussed before.

There is a demand, therefore, for a way of easily manufacturing metal silicide targets and metal alloy targets that are more homogeneous and finer in crystal structures with less oxygen contents than heretofore possible.

[OBJECTS OF THE INVENTION]

It is an object of the present invention to establish a technique of manufacturing metal silicide and metal alloy targets capable of meeting possible future requirements for more homogeneous, finer target crystal structures, while avoiding the above-mentioned problems of the prior art.

A specific object of the invention is to establish a technique of manufacturing metal silicide targets capable of meeting possible future requirements for more homogeneous, finer target crystal structures especially capable of reducing. It is an object to provide a manufacturing technique oxygen contamination during the preparation, compaction, and sintering of metal silicides, but without posing the above-mentioned problems of the prior art.

Another specific object of the invention is to establish a technique of manufacturing metal alloy targets, such as W—Ti targets, capable of eliminating the steps of hydrogenation and dehydrogenation, and capable of meeting possible future requirements for more homogeneous, finer target crystal structures while maintaining desired oxygen levels.

[SUMMARY OF THE INVENTION]

The currently employed manufacturing processes have, in themselves, the foregoing problems as obstacles to further size reduction of the powder materials. In an effort to solve these problems, we conceived of adopting mechanical alloying as a novel approach to the manufacture of powders for sputtering targets. Our investigations and experiments have revealed the following:

(1) Mechanical alloying provide targets more homogeneous and finer in structure than heretofore known.

(2) A metal silicide powder prepared by mechanical alloying yields, upon compaction and sintering, a high melting temperature silicide target. The target has a homogeneous, fine crystal structure, with free silicon phases 5 $\mu$m or finer in size, and with an oxygen concentration of 500 ppm (by weight) or less. This crystal structure has seldom been manufactured by prior art processes.

(3) The particles prepared by mechanical alloying are secondary particles of a metal silicide 10 to 20 $\mu$m in particle size. The secondary particles are aggregates of primary silicide particles of the 5 $\mu$m or smaller in size. Hot pressing the secondary particles gives a high melting temperature silicide target having a homogeneous, fine crystal structure, with free silicon phases 5 $\mu$m or smaller in size and an oxygen concentration of 500 ppm (by weight) or less. Such silicide targets have been difficult to manufacture conventionally. The use of the secondary particles has been found extremely helpful in alleviating the oxidation problem.

(4) The metal silicide and alloy powders prepared by mechanical alloying permit the use of lower hot press temperatures than have been used before. This results in the surprising advantages of reduced oxidation and reduced crystal grain coarsening. Thus, mechanical alloying is beneficial not only to the preparation of metal silicide and alloys but is also beneficial to the prevention of the material's contamination with oxygen and the like, as a result of the use of lower hot press temperatures.

(5) Hot pressing W—Ti alloy powder prepared by mechanical alloying, containing secondary particles, such as particles 10 $\mu$m or larger in particle size, yields a target having a homogeneous, fine crystal structure, with Ti-rich phases 50 $\mu$m or smaller in size and with an oxygen concentration well within a desirable range that is difficult to obtain by ordinary methods. Hydrogenation and dehydrogenation do not in the least take part in this process.

(6) Mechanical alloying can handle material powders of relatively large particle sizes, and therefore averts the problem of oxygen intrusion which otherwise accompanies the use of fine starting material powders. Moreover, the use of secondary particles is very effective in lessening the oxidation problem.

The present invention, based upon the above findings, provides (A) a method of manufacturing a sputtering target selected from the group consisting of metal silicide targets and alloy targets which comprises the steps of mechanically alloying either silicon and a metal powder for constituting a metal silicide or a plurality of metal powders for constituting an alloy to thereby produce a metal silicide powder or alloy powder and then pressing the metal silicide powder or alloy powder. The pressing is preferably performed by a hot press or HIP technique.

Specifically, the invention provides: (A-1) a method of manufacturing a metal silicide target according to (A) which comprises the steps of mechanically alloying a metal and silicon in a silicon/metal molar ratio of 2.0 or above to thereby prepare a metal silicide powder which consists of secondary particles 10 μm or larger in particle size as aggregates of primary particles 5 μm or smaller in size, and then hot pressing the resulting metal silicide powder; (A-2) a method according to (A) wherein the target is composed of a high-melting point metal silicide with a melting point in excess of 1000° C., which method comprises preparing a metal silicide powder with a particle size range of 10 μm or more by mechanical alloying and then hot pressing the metal silicide powder at a temperature between 900° and 1400° C.; and (A-3) a method according to (A) wherein the target is composed of a metal silicide having a melting point of 1000° C. or below, which method comprises preparing a metal silicide powder with a particle size range of 10 μm or more by mechanical alloying and then hot pressing the metal silicide powder at a temperature between 500° and 950° C.

The invention further provides, specifically, (A-4) a method according to (A) wherein the target is composed of an alloy target consisting of 80 to 99 wt % W and 1 to 20 wt % Ti, which method comprises the steps of mechanically alloying 80 to 99 wt % tungsten powder and 1 to 20 wt % titanium powder to thereby prepare an alloy powder composed of particles 10 μm or more in particle size and then hot pressing the alloy powder at a temperature preferably between 900° and 1500° C.

The invention also provides (B) a sputtering target selected from the group consisting of metal silicide targets and alloy targets, which target is manufactured in accordance with the method (A) by the steps of mechanically alloying either silicon and a metal powder for constituting a metal silicide or a plurality of metal powders for constituting an alloy, and then pressing the resulting metal silicide powder or alloy powder. In the case of silicide targets, the products satisfy at least one of the requirements as such; that is, a silicon/metal molar ratio of 2.0 or more, an oxygen content by weight of 500 ppm or less, and a free silicon phase having a size of 5 μm or less. In the case of alloy targets, specifically a W—Ti target, the average particle diameter of the Ti-rich phase is 50 μm or less.

The term "mechanical alloying" as used herein means a process which comprises charging a hermetically sealable container with a mixture of a plurality of different material powders together with hard balls or rods as a fracturing or milling medium, and milling the charge by tumbling or mechanically agitating the charge until the components attain a super-finely mixed or alloyed state, or an ultimately amorphized state. The report, entitled "Mechanical alloying behavior in metal-silicon systems," Funtai oyobi Funmatsu Yakin (Powders and Powder Metallurgy), Vol.37, No.5, pp. 60–63. It deals with Ni—Si and Mo—Si systems directed to general construction members and heating elements. There is no reference whatever made in this report to matters characteristic of metal silicide sputtering targets. Additional reports are collectively summarized in "Mini-special: Trends of Recent Research on Mechanical Alloying" BULLETIN OF THE JAPAN INSTITUTE OF METALS, Vol. 27, No. 10 (1988). None of the reports refers to W—Ti alloys, to say nothing of matters concerned with sputtering targets.

[DETAILED DESCRIPTION OF THE EMBODIMENTS]

According to the process of the invention, a high energy mill, e.g., ball mill, rod mill, or tumbling mill, protected against contamination from the grinding medium and the container, is charged with raw material powders ranging in average particle diameter preferably from 1 to 100 μm. The raw material powders for a silicide target comprise a silicon powder and a refractory metal powder, such as a refractory metal powder of tungsten, molybdenum, tantalum, niobium, or cobalt, which gives a silicide with melting point in excess of 1000° C. or a metal powder, such as of nickel, which affords a silicide with a melting point of 1000° C. or below. For an alloy target, powders of a plurality of different metals are chosen from among the above metals. If the average particle diameter of the raw material powders introduced into mill is over 100 μm, the silicidizing by mechanical alloying takes too much time. Conversely if the average particle diameter is less than 1 μm, the powders are unsuited for milling because of an excessive oxygen concentration. Desirably, the ratio of the amount of raw material powders to the amount of the grinding medium ranges from 1:10 to 1:100. If the ratio is less than 1 to 100, the amount treated per batch is too small for quantity production. If the ratio is more than 1 to 10, silicidizing requires an unduly long time. After charging of the raw materials, the vessel is filled with an inert atmosphere, to avoid oxygen contamination during the course of mechanical alloying.

Alloy targets to which the present invention is particularly directed are targets of W—Ti alloys, specifically targets of W—Ti alloys for sputtering use, containing 1 to 20 wt % of Ti. To form diffusion barrier films for IC devices, W—Ti alloy targets typically containing about 10 wt % of titanium are used. For the purposes of the present invention, alloys containing 1 to 20 wt % of titanium may be employed.

The time required for mechanical alloying largely depends on the particle size of the raw materials charged into the vessel and the ratio of the amount of the charge to the amount of the grinding medium. Mechanical alloying proceeds through four stages. Grinding and mixing of the raw material powder mixture are carried out in the first stage. In the second stage, rapid and fine division, agglomeration and welding of the mixed powder are repeated until the particles of the raw material powders, now finely divided to a submicron level, form aggregates tens of microns in diameter. In the third stage, the aggregates gradually take an equi-axed shape. Homogenization of the raw material powder mixture progresses for mixing on the atomic level until alloying takes place. In the fourth and last stage the crystal structure of the alloyed material mixture is finally broken and the alloy become amorphous.

In the present invention, the properties of the desired mechanically alloyed powder correspond to the properties of the material in the third stage of the alloying process. The powder is in the state of secondary particles, or aggregates about 10 $\mu$m or larger in size consisting of primary particles 5 $\mu$m or smaller in size. In the case of a silicide powder, the powder is in the state of secondary particles that are aggregates of about 10 $\mu$m or larger, specifically between 10 and 20 $\mu$m, which aggregates consist of 5 $\mu$m or smaller primary particles of a metal silicide. The metal silicide forms a solid solution saturated with silicon in a molar ratio of 2 or more. The secondary particles thus formed by the aggregation of primary particles embrace individual primary particles therein. They therefore have excellent oxidation resistance. Since the aggregates are most adequate in size for pressing, the resulting powder is ideally suited as a material for fabricating spattering targets by hot pressing. It is desirable to obtain secondary particles that have aggregated to a size of 10 $\mu$m or larger, because particles smaller than 10 $\mu$m are highly susceptible to contamination with oxygen after their withdrawal from the vessel following the mechanical alloying. In the case of a silicide powder, the aggregates of primary particles of a refractory metal and silicon yet-to-be-silicidized that emerge in the second stage must be subjected to silicide synthesis, grinding, and classification prior to pressing, as in conventional processes. On the other hand, the amorphized particles that come out of the fourth stage are not suited for quantity production due to the longer milling time required; but they are usable anyhow.

The mechanically alloyed powder so obtained is pressed by hot press, HIP, or other known techniques and sintered in the usual manner.

According to the invention, the silicide powder, in which silicide particles in a finely divided state are distributed uniformly, may be sintered at a lower temperature than heretofore utilized, in the range of 500° to 1400° C., preferably in the range of 700° to 1350° C. Sintering of a high-melting silicide having a melting point above 1000° C. can be performed in the temperature range of 900°–1400° C. A metal silicide with a melting point of 1000° C. or below can be sintered in the temperature range of 500°–950° C. This is another major advantage of the invention. During sintering under pressure, silicon that has formed a supersaturated solid solution in the mechanically alloyed powder precipitates from the solution as microscopic particles into the boundaries of the primary particles, and inside the primary particles. As a consequence, the crystal structure of the silicide target becomes a homogeneous, fine crystal structure containing free silicon phases 5 $\mu$m or smaller in size with an oxygen concentration of no more than 500 ppm (by weight). In conventionally prepared crystal structures, by contrast, there are free silicon phases up to 20 $\mu$m in size and, if the free silicon phases are finely divided, the oxygen concentration can exceed 500 ppm. The mechanical alloying method according to the present invention directly gives secondary particles as aggregates silicide of primary silicide particles. The aggregates are about 10 $\mu$m or larger in size. The primary particles are not larger than 5 $\mu$m. Silicone is in a molar ratio of 2 or more to form a supersaturated solid solution. The method of the invention thus obviates the necessity of chemical synthesis of a silicide, followed by grinding, and classification of the resulting powder, which are steps common to prior art methods. The elimination of these steps minimizes the risk of contamination with oxygen.

The omission of the chemical synthesis of a metal silicide through a silicidizing reaction of a metal powder and a silicon powder is highly beneficial. The drawbacks of chemical synthesis such as the need for heating, molar ratio adjustment, and silicon evaporation are limited.

Alloy powders too are hot pressed to high densities under conditions suited for individual types of powders. For example, hot pressing conditions for mechanically alloyed W—Ti alloy powders are as follows:

(1) Temperature: 900°–1500° C.
If the temperature is too low, the powder density will not increase. If the temperature is excessive, the number of particles in Ti-rich phases will decrease, but the oxygen content will increase.

(2) Pressure: 250 kg/cm$^2$ or more
The pressure which may be applied to a press is dictated by the proof stress of the die used. Where a die of high proof stress is available, a correspondingly high press pressure is used.

(3) Time: 30 min.–2 hrs.
The pressing duration is suitably chosen depending on the pressing temperature and pressure. The point at which no further press displacement occurs signals the conclusion of the pressing process. However, it is permissible to hold the pressing for some time. Prolonged press holding decreases the number of particles in the Ti-rich phases.

(4) Atmosphere: vacuum ($10^{-5}$ Torr)
According to the invention, the sintering temperature may be lower and the pressing time shorter than before, since the W—Ti alloy at the time of hot pressing is already in the form of uniform fine particles. The lower hot pressing temperature and shorter pressing time are great advantages in that they lessen the oxidation that results from hot pressing. The lower hot pressing temperatures and shorter pressing time also prevent coarsening of the crystal grains.

The W—Ti target thus manufactured has a structure which consists, of W-rich phases among which Ti-rich phases are dispersed. The average particle diameter of the Ti-rich phases is 50 $\mu$m or smaller. Consequently, the target according to the invention does not give off many particles on sputtering. It is desirable that the number of particles in the Ti-rich phases in the surface portion of the target be limited to at most 400/mm$^2$ through optimization of the hot pressing conditions. Desirably, in a W-10 wt % Ti target, the W-rich phases should contain at least 7 wt % Ti.

[EXAMPLES]

(Example 1: $WSi_{2.7}$)

(A) Material powders

W powder: average particle diameter = 5 $\mu$m oxygen concentration = 150 ppm (wt)

Si powder: average particle diameter = 80 $\mu$m oxygen concentration = 200 ppm (wt)

(B) Milling equipment

A rod mill protected against contamination was used.

(C) Milling conditions

Volume ratio of raw material powders to rods as the grinding medium was 1:40.

Milling (rotating) speed was 60 rpm.

After the charging of the raw material powders, the container was swept out with Ar.

(D) Results

After 200 hours of milling, a powder of secondary particles was obtained as aggregates about 50 μm in size of primary particles of a silicide 1 μm or smaller, in which silicon formed a supersaturated solid solution. The powder immediately after its discharge from the vessel had an oxygen concentration of 250 ppm (by weight). This silicide powder was hot pressed under a vacuum at 1300° C. to fabricate a tungsten silicide target of the above-mentioned molar ratio. It was confirmed upon analysis of the target structure that the maximum particle diameter of the free silicon phases contained in the target did not exceed about 2 μm.

(Example 2: $MoSi_{2.7}$)

(A) Material powders

Mo powder: average particle diameter = 5 μm oxygen concentration = 150 ppm(wt)

Si powder: average particle diameter = 80 μm oxygen concentration = 200 ppm(wt)

(B) Milling equipment

A rod mill protected against contamination was used.

(C) Milling conditions

Volume ratio of material powders to rods as the grinding medium was 1:40.

Milling (rotating) speed was 60 rpm.

After the charging of the raw material powders, the container was swept out with Ar.

(D) Results 250 hours of milling gave a powder of secondary particles as aggregates about 50 μm in size of primary particles of a silicide 1 μm or smaller, in which silicon formed a supersaturated solid solution. The powder immediately after its discharge from the vessel had an oxygen concentration of 250 ppm (by weight). This silicide powder was hot pressed under a vacuum at 1300° C. to fabricate a molybdenum silicide target of the above-mentioned molar ratio. An analysis of the target structure revealed that the maximum particle diameter of the free silicon phases contained in the target did not exceed about 2 μm.

(Example 3: $NiSi_{2.7}$)

A nickel silicide target was made from nickel powder and silicon powder under the same conditions as used in Examples 1 and 2. The only exception was that the vacuum hot pressing temperature was changed to 850° C. It was confirmed again that the maximum particle diameter of the free silicon phases in the target did not exceed about 2 μm.

(Example 4: W—Ti alloy)

(A) Material powders

W powder: average particle diameter = 5 μm oxygen concentration = 150 ppm (wt)

Ti powder: average particle diameter = 100 μm oxygen concentration = 1200 ppm(wt)

(B) Milling equipment

A rod mill protected against contamination was used.

(C) Milling conditions

Volume ratio of material powders to rods as the grinding medium was 1:40.

Milling (rotating) speed was 60 rpm.

After the introduction of the raw material powders, the container was swept out with Ar.

(D) Results

After 200 hours of milling, a powder of secondary particles was obtained as aggregates about 50 μm in size of primary particles of a W—Ti alloy 1 μm or smaller. The powder immediately after its discharge from the vessel had an oxygen concentration of 700 ppm (by weight). This W—Ti alloy powder was hot pressed under a vacuum at 1350° C. to fabricate a W-10 wt % Ti target. An analysis of the target structure showed that the maximum particle diameter of the Ti-rich phases contained in the target did not exceed about 2 μm. The oxygen concentration was also maintained at the desired level of 700 ppm.

[ADVANTAGES OF THE INVENTION]

The manufacture of silicide and alloy targets far more homogeneous and finer in structures than conventional products is now possible. In the case of silicide targets, metal silicide sputtering targets of homogeneous, fine crystal structures with free silicon phases 5 μm or smaller in size and with oxygen concentrations of 500 ppm (by weight) or less that have been difficult to fabricate conventionally can now be made. Since the particle problem is overcome while contamination with oxygen is lessened, potential future requirements for further homogeneity and fineness of target crystal structures will be met. Taking the W—Ti system for example, W—Ti alloy films that serve as good insulating barriers can now be formed, even for IC devices in which the wirings or interconnections are less than one micron wide. This enhances the reliability of those IC devices. Mechanical alloying combines with a lowered hot pressing temperature to make possible the manufacture of sputtering targets having homogeneous, fine crystal structures with Ti-rich phases 50 μm or smaller in size and with oxygen concentrations kept in desirable levels, the fabrication of which has been next to impossible for conventional manufacturing processes.

What is claimed is:

1. A method of manufacturing an alloy target for sputtering which comprises the steps of charging raw material powders into a mill, said raw material powders having average particle diameters of 1 to 100 μm, mixing and pulverizing said raw material powders in said mill to produce an alloy powder by mechanical alloying, and sintering under pressurization the allow powder obtained to form a sintered body from which said alloy target is manufactured.

2. A method according to the claim 1 wherein the alloy powder produced by the mechanical alloying has an average particle diameter of no less than 10 μm.

3. A method according to the claim 1 wherein the alloy powder produced by the mechanical alloying consists of secondary particles 10 μm or larger in particle size as aggregates of primary particles 5 μm or smaller in size.

4. A method according to the claim 1 wherein the alloy powder produced by the mechanical alloying is composed of amorphized particles having an average particle diameter of no less than 10 μm.

5. A method of manufacturing an alloy target for sputtering which comprises the steps of
charging raw material powders into a mill, said raw material powders having average particle diameters of 1 to 100 μm,
mixing and pulverizing said raw material powders in said mill to produce an alloy powder by mechanical alloying, and
sintering under pressurization the alloy powder obtained by subjecting said alloy powder to hot pressing at a temperature of 900° to 1500° C. to form a sintered body from which said alloy target is manufactured.

6. A method according to the claim 5 wherein the alloy powder produced by the mechanical alloying has an average particle diameter of no less than 10 μm.

7. A method according to the claim 5 wherein the alloy powder produced by the mechanical alloying consists of secondary particles 10 μm or larger in particle size as aggregates of primary particles 5 μm or smaller in size.

8. A method according to the claim 5 wherein the alloy powder produced by the mechanical alloying is composed of amorphized particles having an average particle diameter of no less than 10 μm.

9. A method of manufacturing a W—Ti alloy target for sputtering which comprises the steps of
charging raw material powders consisting of 80 to 99 wt % W and 1 to 20 wt % Ti into a mill, said raw material W and Ti powders having average particle diameters of 1 to 100 μm,
mixing and pulverizing said raw material powders in said mill to produce a W—Ti alloy powder by mechanical alloying, and
sintering under pressurization the W—Ti alloy powder obtained to form a sintered body from which said W—Ti alloy target is manufactured.

10. A method according to claim 9 wherein the W—Ti alloy powder produced by the mechanical alloying has an average particle diameter of no less than 10 μm.

11. A method according to claim 9 wherein the W—Ti alloy powder produced by the mechanical alloying consists of secondary particles 10 μm or larger in particle size as aggregates of primary particles 5 μm or smaller in size.

12. A method according to claim 9 wherein the W—Ti alloy powder produced by the mechanical alloying is composed of amorphized particles having an average particle diameter of no less than 10 μm.

13. A method of manufacturing a W—Ti alloy target for sputtering which comprises the steps of
charging raw material powders consisting of 80 to 99 wt % W and 1 to 20 wt % Ti into a mill, said raw material W and Ti powders having an average particle diameters of 1 to 100 μm,
mixing and pulverizing said raw material powders in said mill to produce W—Ti alloy powder by mechanical alloying, and
sintering under pressurization the W—Ti alloy powder obtained by subjecting it to hot pressing at a temperature of 900° to 1500° C. to form a sintered body from which said W—Ti alloy target is manufactured.

14. A method according to claim 13 wherein the W—Ti alloy powder produced by the mechanical alloying has an average particle diameter of no less than 10 μm.

15. A method according to claim 13 wherein the W—Ti alloy powder produced by the mechanical alloying consists of secondary particles 10 μm or larger in particle size as aggregates of primary particles 5 μm or smaller in size.

16. A method according to claim 13 wherein the W—Ti alloy powder produced by the mechanical alloying is composed of amorphized particles having an average particle diameter of no less than 10 μm.

17. A method of manufacturing a metal silicide target for sputtering, which comprises the steps of
mechanically alloying silicon and a metal in a silicon/metal molar ratio of 2.0 or more to produce a metal silicide powder which consists of secondary particles 10 μm or larger in particle size as aggregates of primary particles 5 μm or smaller in size; and
hot pressing the resulting metal silicide powder.

18. A method of manufacturing a metal silicide target for sputtering comprising a high melting point metal silicide having a melting point in excess of 1,000° C., which method comprises the steps of
mechanically alloying a metal and silicon to produce a metal silicide powder having a particle size of 10 μm or more; and
hot pressing the metal silicide powder at a temperature of between 900° and 1400° C.

19. A method of manufacturing a metal silicide target for sputtering comprising a metal silicide having a melting point of 1,000° C. or below, which method comprises the steps of
mechanically alloying a metal and silicon to produce a metal silicide powder having a particle size of 10 μm or more; and
hot pressing the metal silicide powder at a temperature of between 500° and 950° C.

* * * * *